(12) United States Patent
Takeuchi et al.

(10) Patent No.: US 7,084,445 B2
(45) Date of Patent: Aug. 1, 2006

(54) HIGH-THROUGHPUT THIN-FILM FABRICATION VACUUM FLANGE

(75) Inventors: Ichiro Takeuchi, Berwyn Heights, MD (US); Russell W. Wood, Wheaton, MD (US); Ratnakar D. Vispute, Columbia, MD (US)

(73) Assignee: University of Maryland, Riversdale, MD (US)

( * ) Notice: Subject to any disclaimer, the term of this patent is extended or adjusted under 35 U.S.C. 154(b) by 62 days.

(21) Appl. No.: 10/489,922

(22) PCT Filed: Oct. 11, 2002

(86) PCT No.: PCT/US02/32431

§ 371 (c)(1),
(2), (4) Date: Mar. 18, 2004

(87) PCT Pub. No.: WO03/032371

PCT Pub. Date: Apr. 17, 2003

(65) Prior Publication Data

US 2004/0231595 A1  Nov. 25, 2004

(51) Int. Cl.
*H01L 29/76* (2006.01)

(52) U.S. Cl. .............................. 257/294; 257/E21.023

(58) Field of Classification Search .......... 204/298.26, 204/298.27, 298.28, 298.31, 157.15, 157.6, 204/192.1, 193, 227, 230.2, 230.3, 230.8, 204/298.01, 298.02, 298.11, 298.15, 298.23, 204/298.24; 257/38, 42, 59, 89, 188, 432, 257/441; 118/663, 665–667, 688, 693, 696, 118/715, 716, 720, 723, 728–730, 504, 300–303, 118/305, 324

See application file for complete search history.

(56) References Cited

U.S. PATENT DOCUMENTS 6,045,671 A * 4/2000 Wu et al. .............. 204/298.11
6,522,390 B1   2/2003 Suzuki et al.

* cited by examiner

*Primary Examiner*—Michael Lebentritt
*Assistant Examiner*—Andre' Stevenson
(74) *Attorney, Agent, or Firm*—Edell, Shapiro & Finnan, LLC

(57) ABSTRACT

A mechanism and methodology is provided for performing high-throughput thin-film experimentation with the use and integration of a heater. A single flange assembly contains an automated two-dimensional shutter system (which provides variable masking schemes for spatially selective shadow deposition) and a rotatable (indexed) chip/wafer/substrate heater. The automated two-dimensional shutter system comprises two shutter plate mounts that move in two perpendicular (x and y) directions, so that mounted shutters overlap with each other in certain regions. The substrate heater can be used in the gradient temperature mode or uniform temperature mode. The shutter plates and the heater plate are detachable and exchangeable from experiment to experiment in order to minimize cross contamination of materials.

23 Claims, 8 Drawing Sheets

HIGH-THROUGHPUT THIN-FILM FABRICATION VACUUM FLANGE

BACKGROUND OF THE INVENTION

1. Field of the Invention

The present invention generally relates to an apparatus for the deposition, synthesis and screening of an array of diverse materials at known locations on a single substrate surface. More specifically, the invention is directed to a physical masking apparatus and methods for applying films of materials to a substrate with deposition techniques, such as sputtering, laser deposition, ion beam, electron beam and thermal evaporation, spray coating and the like.

2. Description of Related Art

The discovery of new materials with novel chemical and physical properties often leads to the development of new and useful technologies. Currently, there is extensive research in the discovery and optimization of materials, such as superconductors, zeolites, magnetic materials, phosphors, nonlinear optical materials, thermoelectric materials, high and low dielectric materials and the like. Unfortunately, even though the chemistry of extended solids has expanded, few general principles have emerged that allow one to predict with certainty the composition, structure and reaction pathways for the synthesis of such solid state compounds.

The preparation of new materials with novel chemical and physical properties is not easily predicted or controlled. Consequently, the discovery of new materials depends largely on the ability to synthesize and analyze new compounds. Given approximately 100 elements in the periodic table which can be used to make compositions consisting of three, four, five, six or more elements, the universe of possible new compounds remains largely unexplored. As such, there exists a need in the art for a more efficient, economical and systematic approach for the synthesis of novel materials and for the screening of such materials for useful properties.

One of the processes whereby nature produces molecules having novel functions involves the generation of large collections (libraries) of molecules and the systematic screening of those collections for molecules having a desired property. This notion of generating and screening large libraries of molecules has recently been applied to the drug discovery process.

Methods have been developed for the synthesis and screening of large libraries of peptides, oligonucleotides and other small molecules. Some methods involve functionalizing the termini of polymeric rods and sequentially immersing the termini in solutions of individual amino acids. In addition, techniques have recently been introduced for synthesizing large arrays of different peptides and other polymers on solid surfaces.

Developing new materials often requires combinatorial deposition of thin-films onto substrates wherein the precise chemical composition, concentrations, stoichiometries and thicknesses of the deposited films is known. To this end, it would be beneficial to construct apparatus and methodology to produce arrays of materials with varying composition, concentrations, stoichiometries and thickness on known locations on a substrate so that the materials can be readily synthesized and analyzed.

Vacuum flanges are basic constituents of thin-film fabrication equipment. Typically, fabrication equipment will have a number of flanges mounted, and each one carries/provides a device that performs a specific task. However, these conventional multi-flange arrangements, which have individual flanges to perform a task, tend to be very expensive and cumbersome.

The need therefore exists for a single vacuum flange adapted to perform different types of spatially selective thin film fabrication on a substrate at variable temperatures, whereby the necessary shutter system is incorporated into the single vacuum flange.

SUMMARY OF THE INVENTION

The present invention provides an apparatus and methodology for the preparation of a substrate having an array of diverse materials in predefined regions thereon. A substrate having an array of diverse materials is prepared by depositing components of target materials onto predefined regions on the substrate to form at least two resulting materials. In particular, the present invention provides physical masking systems and methods for applying components onto a substrate in a combinatorial fashion, thus creating arrays of resulting materials that differ slightly in composition, stoichiometry, and/or thickness. Moreover, using the novel masking systems of the present invention, components of target materials can be delivered to each site in a uniform distribution, or in a gradient of stoichiometries, thicknesses, compositions, etc. Resulting materials which can be prepared using the methods and apparatus of the present invention include, for example, covalent network solids, ionic solids and molecular solids. Once prepared, these resulting materials can be screened in parallel for useful properties including, for example, electrical, thermal, mechanical, morphological, optical, magnetic, chemical and other properties.

The apparatus of this invention greatly facilitates thin film experimentation by integrating all the necessary components in a single vacuum flange to perform different types of spatially selective thin film fabrication (on a given chip or a wafer) at variable temperatures.

In particular, the flange of this invention contains an automated two-dimensional shutter system (which provides variable masking schemes for spatially selective shadow deposition) and a rotatable (indexed) chip/wafer/substrate heater. The automated two-dimensional shutter system comprises two overlapping shutter plate mounts that move in two perpendicular (x and y) directions, so that the mounted shutters overlap with each other in certain regions. The shutter plates, pedestal and the modular heater assembly are detachable and exchangeable from experiment to experiment in order to minimize cross contamination of materials.

Spatially selective fabrication is achieved by shadow deposition technique, where thin film materials being fabricated with a mask over a substrate will only be deposited on the substrate in the region of opening in the mask. The shutters provide the masks. Different aperture shapes or opening patterns can be cut into the shutters in order to create different layout designs for series of shadow depositions and thus, different designs of combinatorial libraries and composition spreads.

The substrate heater of the flange also contains a gradient temperature mechanism so that different parts of a mounted substrate can be heated to different temperatures at the same time. The integrated heater assembly allows fabrication of thin film samples at different temperatures in a single experiment on a given chip. The heater assembly is of great importance in thin film fabrication experiments in general because deposition temperature often plays a crucial role in determining the physical property of a material. Thus, deposition temperature is another important parameter that one would like to be able to vary in a high throughput manner.

There are different mechanisms that can be used to create the gradient temperature across the heater plate. This invention should not be limited to any specific mechanisms for achieving the gradient temperature. This invention pertains to a mechanism and methodology for performing high-throughput thin-film experimentation with the use and integration of a heater. The substrate heater can be used in the gradient temperature mode or uniform temperature mode. Having the gradient temperature capability together with the automated shutter mechanism incorporated into a single vacuum flange significantly enhances the flexibility and widens the scope of experiments that can be performed with the flange.

The flange can be, for example, 6" in its outer diameter, and it is, thus, compact and portable. This flange can be placed in any type of thin film fabrication equipment having a 6" or larger port to "convert" the equipment into high-throughput thin film fabrication equipment. Different types of thin film fabrication equipment to which the flange can be incorporated into include pulsed laser deposition, magnetron sputtering, ion beam sputtering, thermal evaporation, e-beam evaporation and chemical vapor deposition.

One advantage of the present invention is that the physical mask system provides precise control over the location and amount of each component deposited onto the selected regions of the substrate. This enables arrays of components with slightly varying composition, concentrations, stoichiometries and thicknesses to be deposited onto known locations on the substrate so that the resulting materials can be readily synthesized and analyzed. In addition, the present invention has the ability to create tens, hundreds or thousands of different masking patterns in front of a substrate. This facilitates the building of combinatorial libraries containing many different resulting materials onto the substrate, with each resulting material comprising a known combination of different components. Since the resulting materials are deposited at known locations on the substrate, they can be readily screened and compared with each other for performance and/or useful properties.

Using this shutter-mask system, a particular geometric shape, such as a rectangle or square of resulting material, can be precisely deposited onto the substrate by moving the opposing pairs of shutters. Rows and columns of components can also be deposited on a substrate by moving one set of opposite shutters while holding the other set stationary.

In another configuration, the physical mask system includes one or more shutter masks that can be translated at a constant or variable speed across the substrate to provide composition, thickness or stoichiometry gradients on the substrate. Typically, each shutter mask will be coupled to a suitable actuator drive, such as a solenoid, pneumatic drive or the like, and a control system for accurately controlling the speed and location of the shutter mask. In this embodiment, the system may also include other stationary masks or open masks for providing step gradients and other thin film geometries on the substrate.

In the delivery systems of the present invention, thin-film deposition techniques are preferably used in combination with the aforementioned masking systems to deposit thin-films of the various components on predefined regions of the substrate. Such thin-film deposition techniques may include sputtering techniques, spraying techniques, laser deposition techniques, electron beam or thermal evaporation techniques, ion beam, ion implantation or doping techniques, chemical vapor deposition (CVD) techniques, as well as other techniques used in the fabrication of integrated circuit devices. The components can be delivered as amorphous films, epitaxial films, or lattice and superlattice structures. Alternatively, the various components can be deposited into the reaction regions of interest from a dispenser in the form of droplets or powder.

A further understanding of the nature and advantages of the inventions herein may be realized by reference to the remaining portions of the specification and the attached drawings.

BRIEF DESCRIPTION OF THE DRAWINGS

FIG. 8b is a cross sectional deposition scheme to create the film of FIG. 8a as seen in the direction of arrow 'A' of FIG. 8a.

DETAILED DESCRIPTION OF PREFERRED EMBODIMENTS

Figure 1:
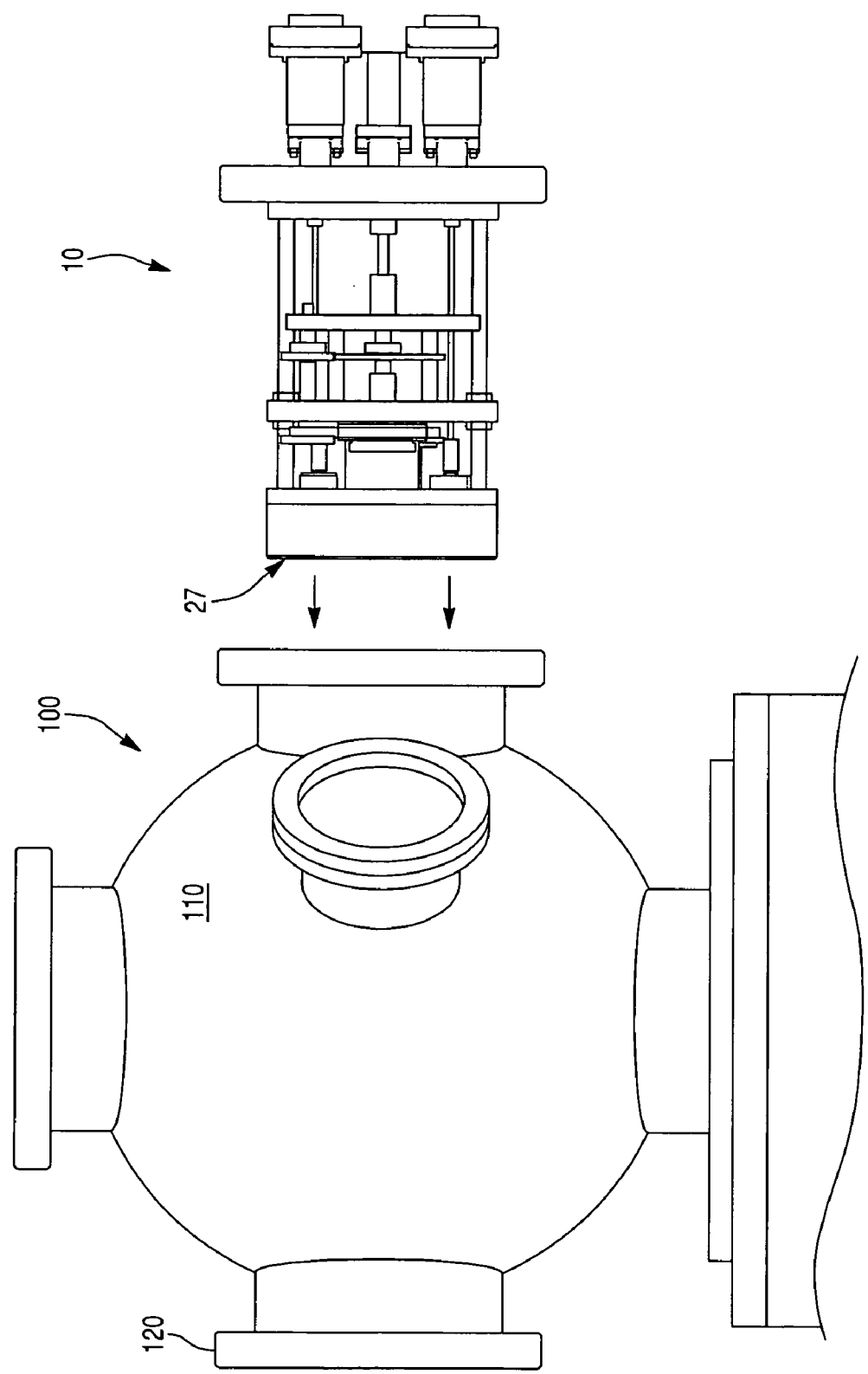
FIG. 1 schematically illustrates a pulse laser deposition (PLD) system and associated processing chamber.

FIG. 1 illustrates a specific embodiment of a multi-target pulse laser deposition (PLD) system 100 according to the present invention. Pulse laser deposition involves the evaporation of molecules from the target to the substrate on the pedestal. In this embodiment, evaporation takes place by hitting the target/source material with short pulses of laser in the presence of a gas, for example, argon, oxygen, nitrogen, etc. As shown in FIG. 1, the PLD system 100 generally includes an enclosure assembly 110 housing a processing chamber under vacuum, a target carousel flange 120, at least one substrate mounted on a pedestal 27 having a substrate support surface for supporting one or more substrates thereon. As would be understood by those of skill in the art, PLD system 100 may further include a substrate load-lock chamber, a physical mask chamber and a target chamber coupled to enclosure assembly 110 for loading/unloading of substrates, physical masks and targets into and out of processing chamber.

The target carousel flange 120 is preferably a multi-target carousel that allows one to evaporate one or more components separately onto a substrate.

Referring again to FIG. 1, PLD system 100 preferably includes a masking shutter system located in front of the substrate support surface for generating arrays of resulting materials on the substrate that differ slightly in composition, thickness and stoichiometry. The masking shutter system is uniquely configured as part of a single vacuum flange as shown in FIGS. 2–5.

Figure 2:
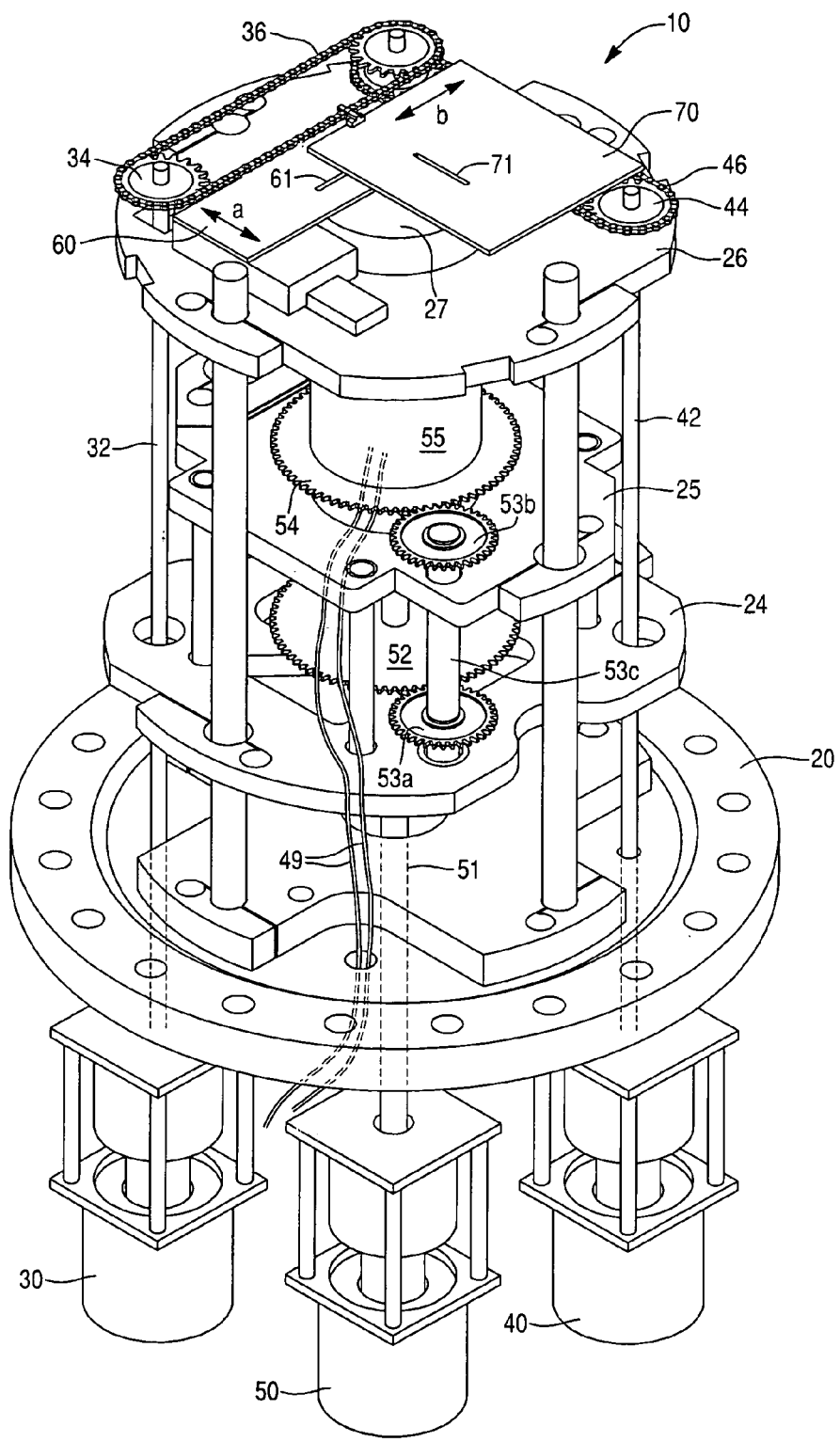
FIG. 2 is a perspective view of one embodiment of the single vacuum flange incorporating the high throughput thin-film fabrication assembly of this invention with some detail removed for clarity.

With reference to FIG. 2, the high throughput thin-film vacuum flange 10 has a main mounting vacuum flange member 20 to which is mounted motor drive systems, a masking shutter assembly and a substrate pedestal/heater assembly. The motor drive systems include first and second shutter motors 30, 40 and a central chip/wafer/heater motor 50. The first and second shutter motors 30, 40 drive a linear motion of first and second shutters 60, 70 in two perpendicular (x and y) directions as will be described in detail below. The central chip/wafer/heater motor 50 provides controlled rotation of a central heater housing 55 and substrate support surface 27 adjacent the central heater housing 55 as will be described in detail below.

The first shutter motor 30 drives a first drive shaft 32 which passes through several support plates 24, 25, 26. The first drive shaft 32 is drivingly connected to a first drive sprocket 34 that drive a first drive chain 36. The first drive chain 36 causes the first shutter 60 to translate in the direction of arrow 'a' in FIG. 2. The second shutter motor 40 drives a second drive shaft 42 which passes through the support plates 24, 25, 26. The second drive shaft 42 is drivingly connected to a second drive sprocket 44 that drive a second drive chain 46. The second drive chain 46 causes the second shutter 70 to translate in the direction of arrow 'b' in FIG. 2. The first and second drive chains 36, 46 also mate with a pair of idler sprockets 35, 45 independently rotatable and disposed on the support plate 26. While the preferred embodiment employs electric motors and chain drive systems for the masking shutters, it will be understood by those of skill in the art that numerous drive systems or belts may be employed without departing from the spirit and scope of this invention.

Figure 3:
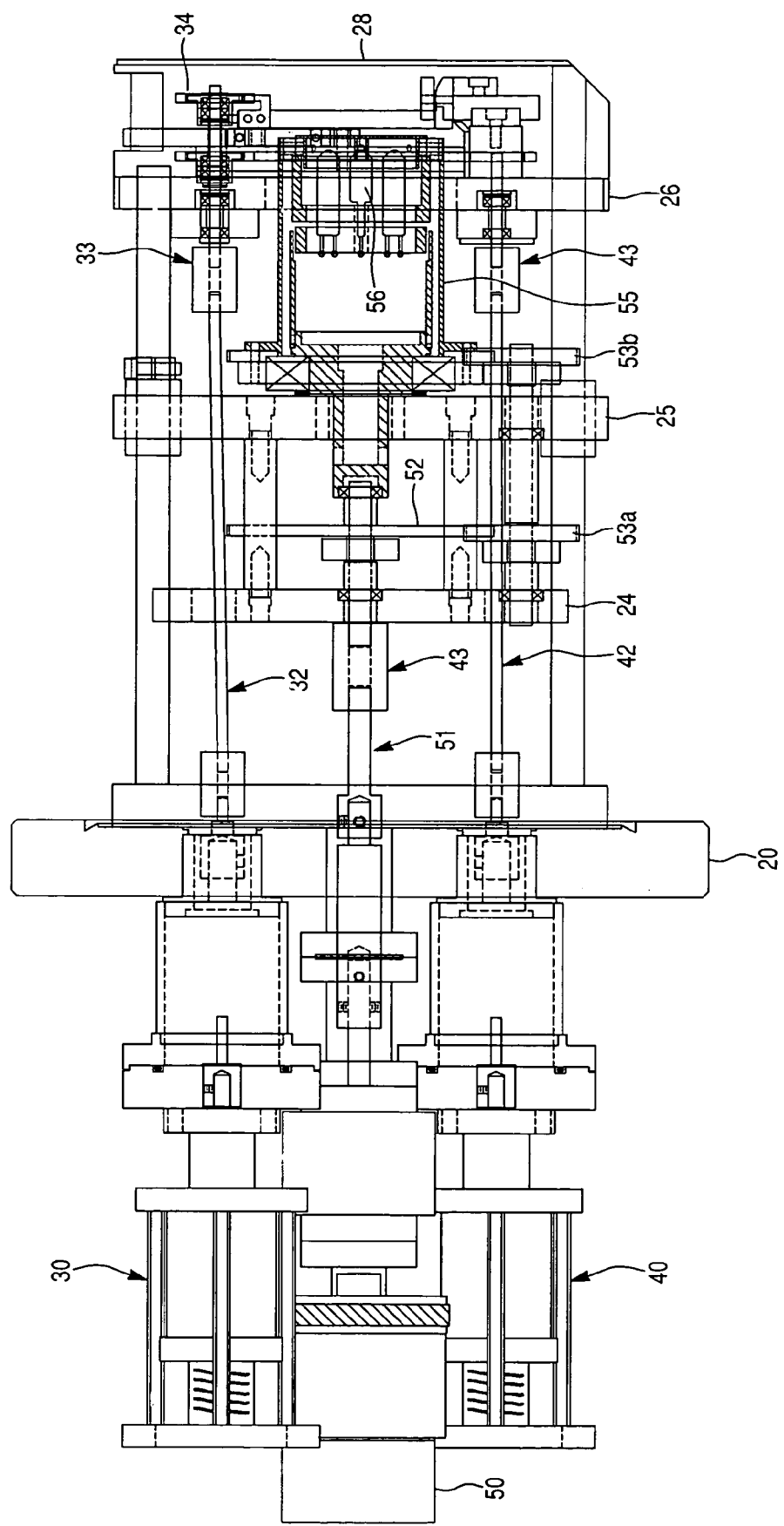
FIG. 3 is a side view of the vacuum flange shown in FIG. 2.

In the preferred embodiment shown in FIG. 3, a flexible coupling 33, 43 may be provided on the drive shafts 32, 42, 51 along the transmission path between the motors 30, 40, 50.

Figure 5:
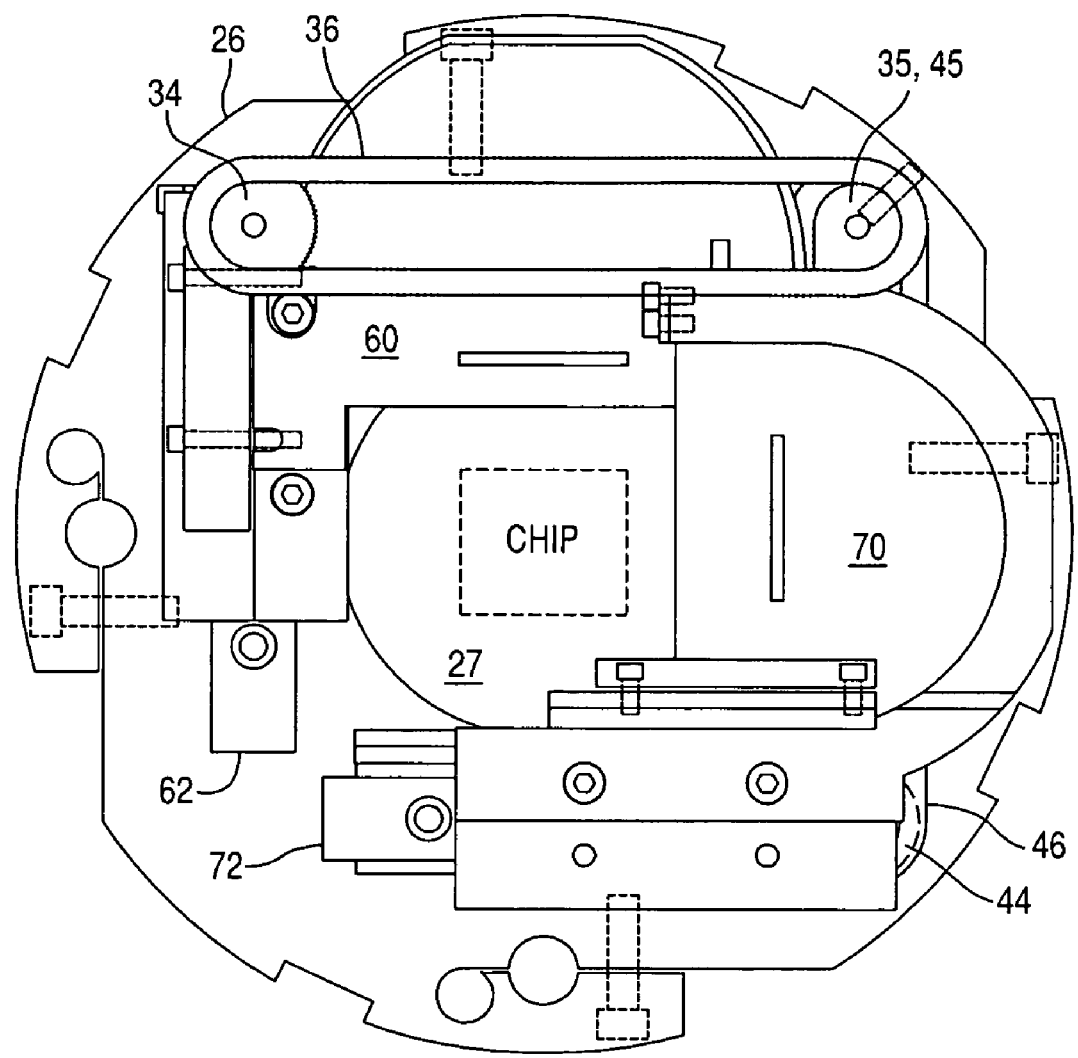
FIG. 5 is a detail showing the shutter assembly of the flange of FIG. 2.

As shown in FIG. 5, shutters 60, 70 are slidably coupled to mounting brackets 62, 72, which are each mounted to support plate 26. Typically, support plate 26 will be adjustably mounted to or made integral with the flange member 20. The flange member 20 is then mounted to an enclosure of a processing chamber (see FIG. 1). Shutter masks 60, 70 will preferably be located relatively close to the substrate to ensure that the components that pass through the opening defined by the masks 60, 70 will deposit onto the region of the substrate underlying opening (i.e., without dispersing outward from this region). The opening is defined by an overlap of the slots 61, 71 formed in the shutter masks 60, 70. Of course, the preferred distance between the shutter masks and the substrate will vary widely based on the type of deposition that is used. Usually, the distance between the lower surfaces of shutter masks 60, 70 and the substrate is about 0 to 2 mm, preferably about 1 micron meter to 200 micron meters. In the representative embodiment, both shutter masks 60, 70 may be independently translated relative to each other.

The actuators, e.g., solenoids, can be driven to reciprocate shutter masks 60, 70 by a variety of conventional or non-conventional drive mechanisms, such as electromagnetic systems, pneumatic systems, linear drive, stepper motors or the like. The drive mechanisms may be located either inside or outside of the vacuum chamber. Preferably, step motors drive the actuators. The shutter mask system of the present invention provides precise control over the location and amount of each component deposited onto selected regions of the substrate. In addition, the shutter masks allows many different (e.g., on the order of tens, hundreds or thousands) masking patterns to be rapidly changed during processing to enable arrays of resulting materials with slightly varying composition, concentrations, stoichiometries and thickness' to be deposited onto known locations on the substrate. To that end, the actuators and drive mechanism are preferably equipped with position feedback mechanisms (i.e., encoders) of the type used in devices for semiconductor device manufacturing and testing. Such mechanisms will preferably be closed loop systems with insignificant backlash and hysteresis.

Preferably, shutter masks 60, 70 are flat, substantially continuous physical masks with a single slot 61, 71 similar to the masks described above in reference to FIG. 2. However, shutter system may also include a variety of physical masks having different sizes, shapes, and patterned openings for delivering component(s) through the openings to the substrate. As such, different aperture shapes or opening patterns can be cut into the shutters in order to create different layout designs for series of shadow depositions and thus, different designs of combinatorial libraries and composition spreads.

Figure 4B:
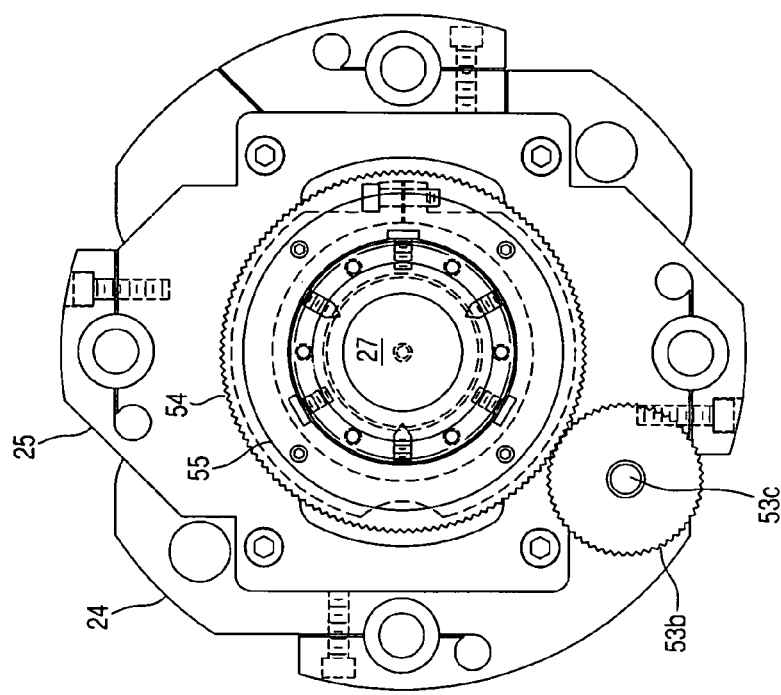
FIGS. 4a and 4b illustrate the substrate pedestal and heater carriage assembly of the flange of FIG. 2.
Figure 4A:
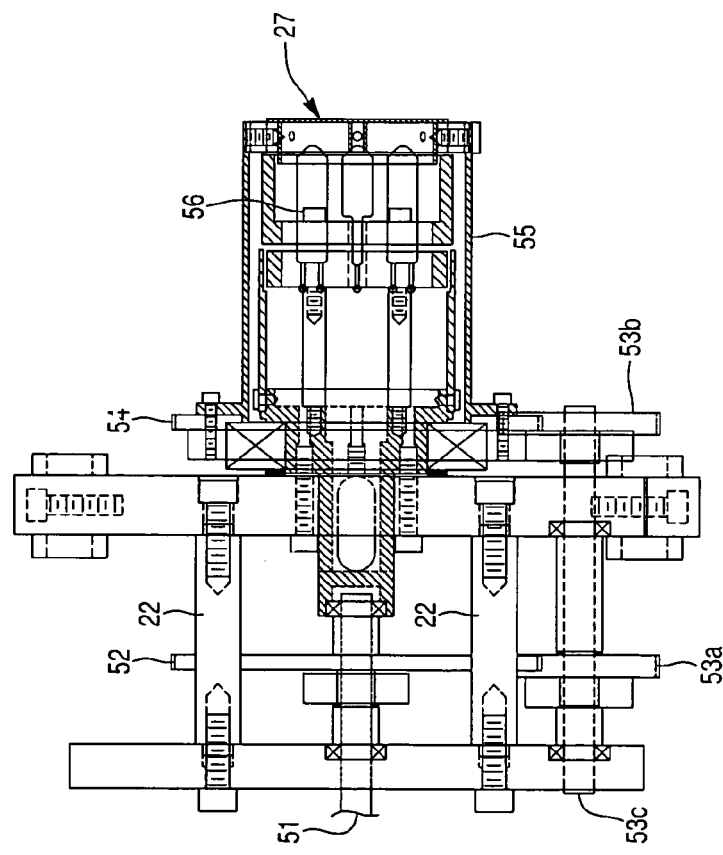

The substrate pedestal and heater assembly is separately illustrated by FIGS. 4a and 4b. The heater carriage assembly includes mounting plates 24, 25 separated by pillar posts 22. Rotatably mounted above the mounting plate 25 is the heater housing 55, which houses heating elements 56. Pedestal 27 is disposed at the top side of the heater housing 55.

The heater housing 55 is rotatably mounted with respect to the mounting plates 24, 25 and is driven by the central chip/wafer/heater motor 50 through a series of drive gears 52, 53a, 53b, 54. The heating elements 56 remain stationary. In the preferred embodiment shown in FIGS. 4a and 4b, the heater motor 50 is mounted to drive a central drive shaft 51 which drives the first drive gear 52. First drive gear 52 matingly engages bypass gears 53a, 53b mounted on side shaft 53c. The bypass gear 53b matingly engages the heater housing gear 54 to rotatably drive the heater housing 55 and pedestal 27. The heater and pedestal drive assembly is arranged to permit an electrical connection with the stationary heating elements 56 located within the heater housing 55 via wires 49 to supply necessary power to the heater elements 56. The bypass gears 53a, 53b permit the heater housing to be mounted on a stationary heater mount through which electricity is transmitted to the heater elements 56.

In additional to the rotational movement imparted to the heater housing 55 and pedestal 27 by the motor 50 and shaft 51, the modular heater assembly illustrated in FIGS. 4a and 4b is adapted to translate in a linear direction defined by the shaft 51 along the pillar post extending between the flange 20 and the plate 26. Such linear movement is accomplished through linear movement of the shaft 51. This arrangement makes it possible to adjust the position of the heater housing 55 and pedestal 27 relative to the shutters 60, 70 and the associated mask assembly.

Pedestal 27 is preferably made from a material having a relatively high thermal mass and good thermal conductivity to facilitate the absorption of heat from the substrate resting on the support surface. Additionally, a protective cover assembly 28 may be disposed above the pedestal 27. As shown in FIGS. 4a and 4b, the heater carriage assembly includes a rotational drive coupled to pedestal 27 for rotating the heater housing and pedestal and the substrate relative to shutter masks 60, 70. In an exemplary embodiment, the system will include thickness monitors (not shown) for measuring the thickness of the deposited component on the substrate in situ. The thickness monitors may provide feedback to the processor to control the deposition rate.

Figure 6:
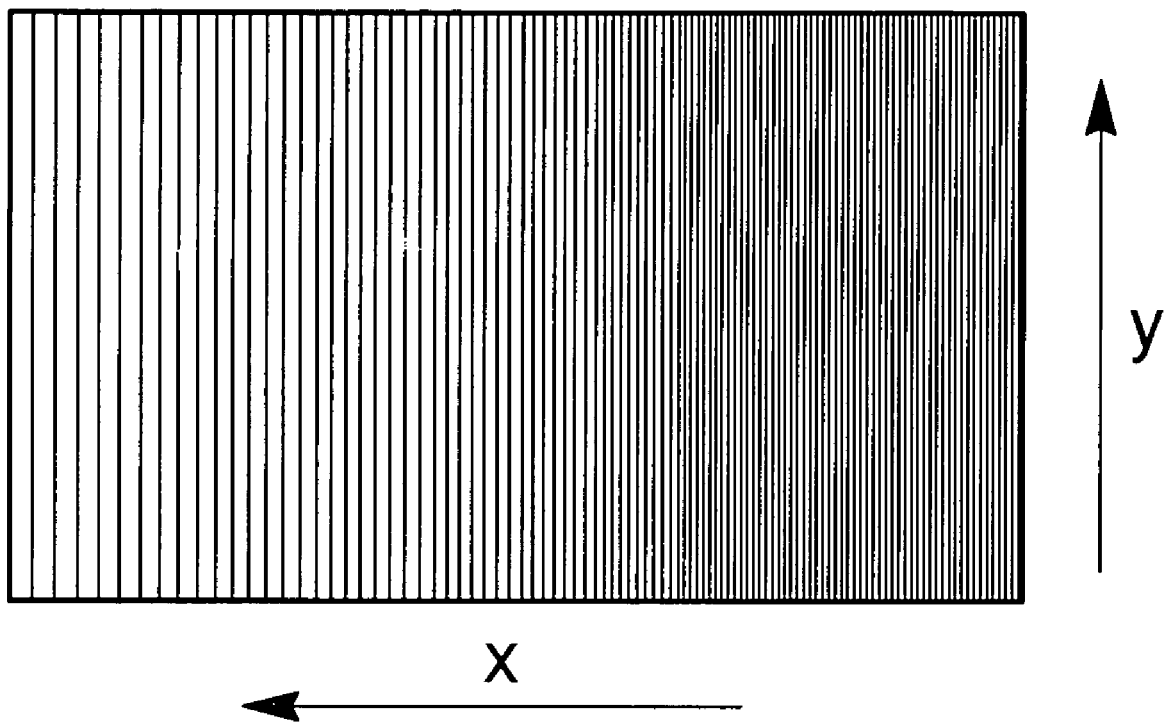
FIG. 6 is a schematic of the high throughput thin film experiment chip.

FIG. 6 is a schematic of the high throughput thin film experiment chip, wherein the films were deposited in such a way so that in the vertical direction 'y' composition was varied and in the horizontal direction 'x' deposition temperature was varied. Such an experiment and experimental chip is highly instrumental in rapidly optimizing a thin film material.

Figure 7:
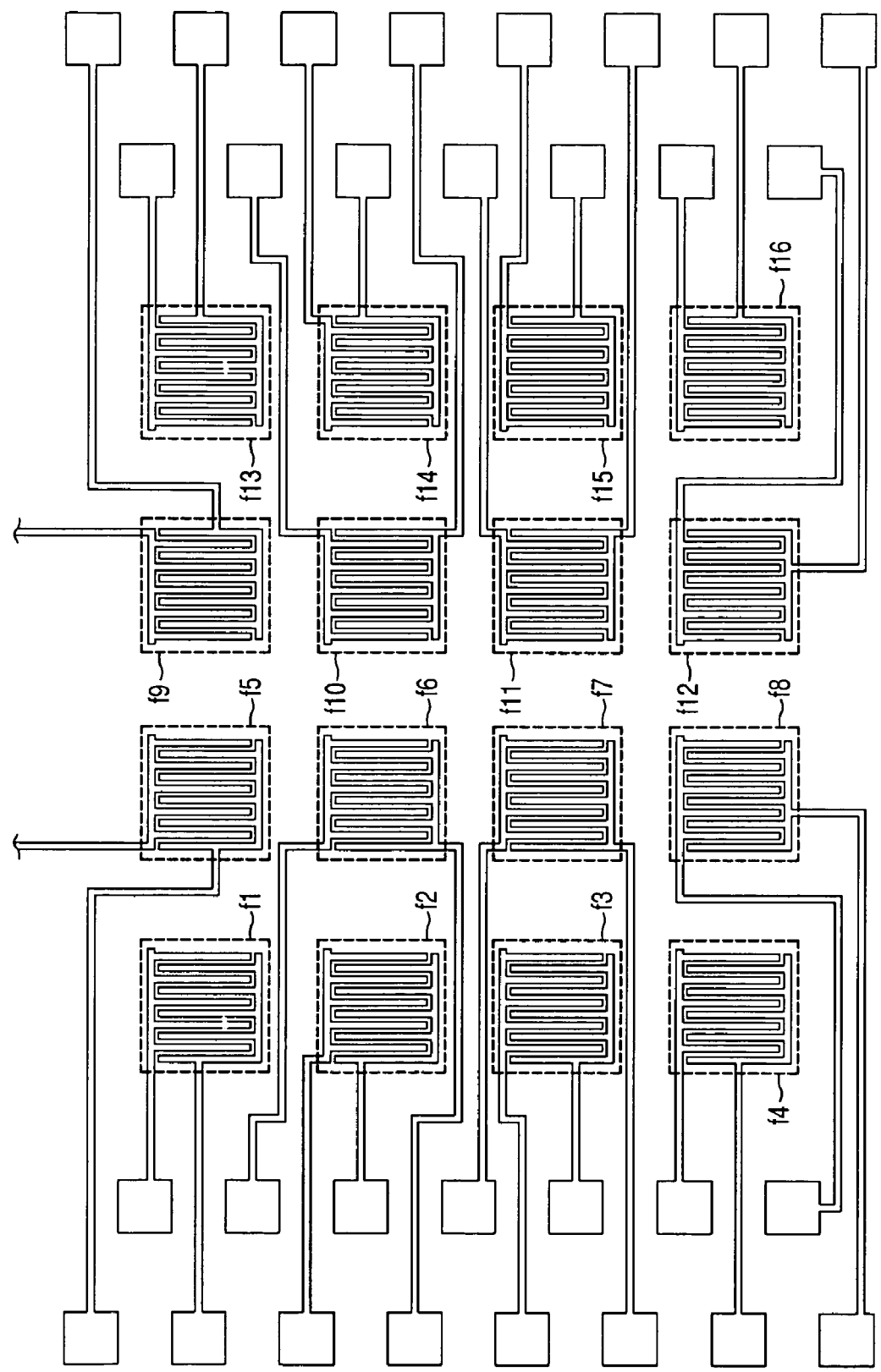
FIG. 7 is an example of a combinatorial thin film library deposited with the invention.

FIG. 7 is an example of a combinatorial thin film library deposited with the high throughput flange of this invention where 16 compositionally different thin films (see films f1 through f16) were deposited at an elevated temperature on 16 different predetermined positions on the chip. Thus, FIG. 7 shows an example of a discrete combinatorial library.

Figure 8A:
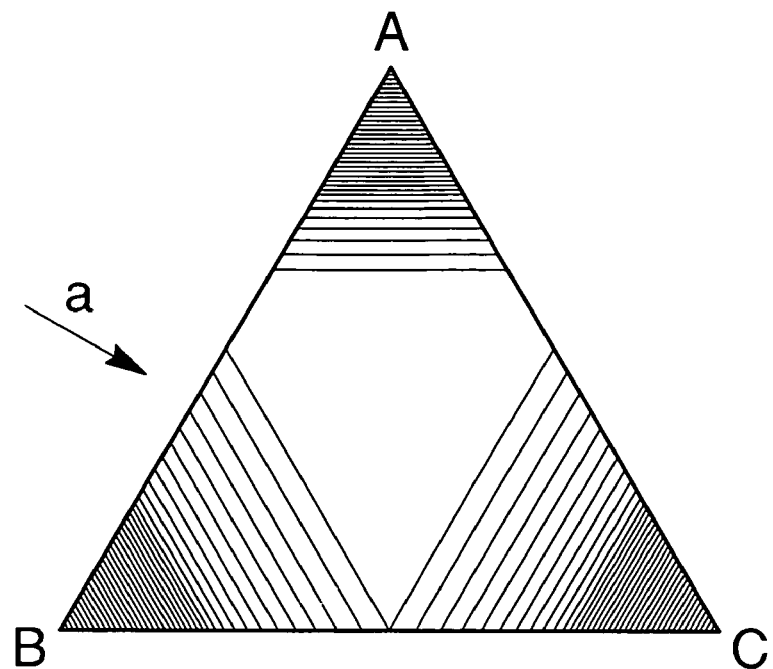
FIG. 8a is a schematic of an in-situ deposited phase diagram chip.
Figure 8B:
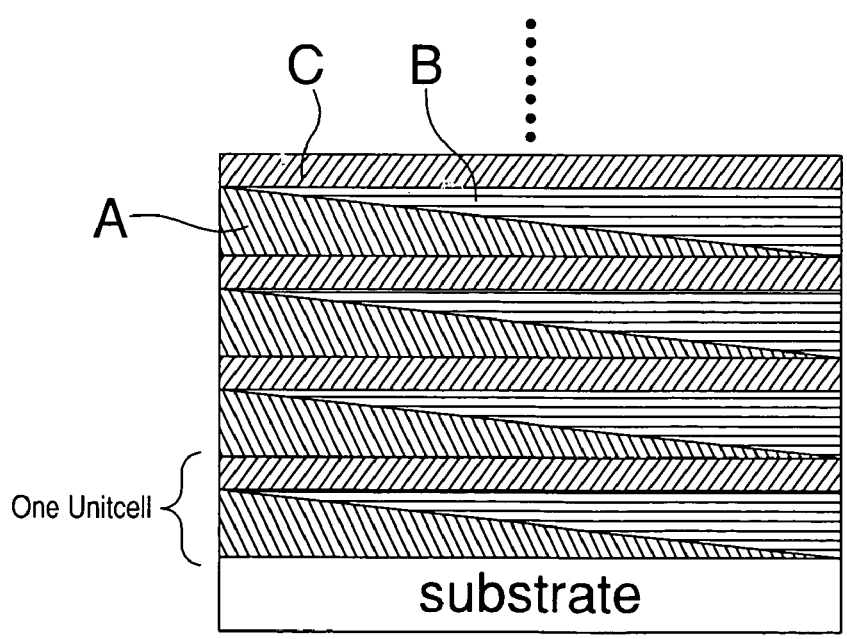

FIG. 8a is a schematic of an in-situ deposited phase diagram chip, and FIG. 8b is a cross sectional deposition scheme to create the film of FIG. 8a as seen in the direction of arrow 'a' of FIG. 8a. The deposition shown in FIGS. 8a and 8b were carried out in an atomic layer-by-layer manner by repeating gradient depositions in three different directions with three different target materials a, b, c. The deposited amount of each layer is less than that of a unit cell. After a set of three gradient depositions for a, b, and c, one unit cell is deposited epitaxially with appropriate composition spread across the chip. Thus, FIGS. 8a and 8b shows a schematic of an in-situ fabricated phase diagram chip where an entire ternary phase diagram is mapped out on a triangular shaped chip. Such an experiment was not readily possible with existing technology; however, it has been accomplished with the present invention.

From the foregoing, it is clear that the present invention provides methods and apparatus for depositing various components onto substrates to generate a diverse array of resulting materials in predefined regions on the substrate. In particular, the present invention provides physical masking systems and methods for applying components onto a substrate in a combinatorial fashion, thus creating arrays of resulting materials that differ slightly in composition, stoichiometry, and/or thickness. Resulting materials which can be prepared in accordance with the methods of the present invention include, for example, covalent network solids, ionic solids and molecular solids. More particularly, resulting materials which can be prepared in accordance with the methods of the present invention include, but are not limited to, inorganic materials, intermetallic materials, metal alloys, ceramic materials, organic materials, organometallic materials, non-biological organic polymers, composite materials (e.g., inorganic composites, organic composites, or combinations thereof), or other materials which will be apparent to those of skill in the art upon review of this disclosure.

From the foregoing description, the substrate heater of the flange also contains a gradient temperature mechanism so that different parts of a mounted substrate can be heated to different temperatures at the same time. The integrated heater assembly allows fabrication of thin film samples at different temperatures in a single experiment on a given chip. The heater assembly is of great importance in thin film fabrication experiments in general because deposition temperature often plays a crucial role in determining the physical property of a material. Thus, deposition temperature is another important parameter that one would like to be able to vary in a high throughput manner.

There are different mechanisms that can be used to create the gradient temperature across the heater plate; therefore, this invention should not be limited to any specific mechanisms for achieving the gradient temperature. This invention pertains to a mechanism and methodology for performing high-throughput thin-film experimentation with the use and integration of a heater. The substrate heater can be used in the gradient temperature mode or uniform temperature mode. Having the gradient temperature capability together with the automated shutter mechanism incorporated into a single vacuum flange significantly enhances the flexibility and widens the scope of experiments that can be performed with the flange.

The substrate having an array of resulting materials thereon will have a variety of uses. For example, once prepared, the substrate can be screened for resulting materials having useful properties, and/or the resulting materials can be ranked, or otherwise compared, for relatively performances with respect to useful properties or other characterizations. Accordingly, the array of resulting materials is preferably synthesized on a single substrate. By synthesizing the array of resulting materials on a single substrate, screening the array for resulting materials having useful properties is more easily carried out. Properties which can be screened for include, for example, electrical, thermal mechanical, morphological, optical, magnetic, chemical, etc. More particularly, properties which can be tested include, for example, conductivity, super-conductivity, resistivity, thermal conductivity, anisotropy, hardness, crystallinity, optical transparency, magnetoresistance, permeability, frequency doubling, photoemission, coercivity, dielectric strength, or other useful properties which will be apparent to those of skill in the art upon review of this disclosure. Importantly, the synthesizing and screening of a diverse array of resulting materials enables new compositions with new physical properties to be identified. Any resulting material found to possess a useful property may be subsequently prepared on a large-scale. It will be apparent to those of skill in the art that once useful resulting materials have been identified using the methods of the present invention, a variety of different methods can be used to prepare such useful materials on a large or bulk scale with essentially the same structure and properties.

Generally, physical masking systems may be employed with deposition techniques for applying components onto a substrate in a combinatorial fashion, thus creating arrays of resulting materials at known locations on the substrate. The arrays of resulting materials will usually differ in composition, stoichiometry, and/or thickness across the substrate. In addition, using the novel masking systems of the present invention, components can be delivered to each site in a uniform distribution, or in a gradient of stoichiometries, thicknesses, compositions, etc. According to some of the embodiments of the present invention, the physical mask system and the substrate are independently movable relative to each other such that patterns of materials may be generated on the substrate. In some embodiments, one or more shutter masks are coupled to actuators or drives for translating, reciprocating or rotating the shutter masks relative to the substrate. In other embodiments, the pedestal is movable so that the substrate may be rotated or translated relative to stationary or movable physical masks. Moving the mask relative to the substrate provides precise control over the location and amount of each component deposited onto selected regions of the substrate.

Specifically, one system of the present invention comprises a housing defining a processing area with a pedestal with a substrate support surface, and a delivery system for depositing one or more components onto a substrate on the support surface of the pedestal. A physical mask system includes two shutter masks coupled to actuators or drives that translate, reciprocate or rotate the shutter masks in directions substantially parallel to the substrate support surface. In one embodiment, this system includes one or more shutter masks that can be linearly translated across the substrate to provide composition, thickness or stoichiometry gradients on the substrate. In another embodiment, the physical masking system includes two pairs of opposing shutters located in different planes from each other. Each opposing pair of shutter masks is coupled to actuators or drives for reciprocating the shutter masks towards and away from each other. Using this shutter-mask system, a rectangle or square of component(s) can be deposited onto a substrate by moving the opposing pairs of shutters. Rows and columns of components can be deposited on a substrate by moving one set of opposite shutters. The location of a particular geometric shape, for example a rectangle, can be controlled using a motor, such as a step-motor, to position the shutter masks.

Generally, films or layers of components can be deposited onto a substrate using a variety of delivery techniques in combination with the aforementioned masking techniques of the present invention. For example, thin-film deposition techniques in combination with physical masking can be used to deliver the various components to selected regions on the substrate. Thin film deposition, sputtering systems, spraying techniques, laser deposition techniques, electron beam or thermal evaporation, ion beam deposition, ion implantation or doping techniques, chemical vapor deposition (CVD), as well as other techniques used in the fabrication of integrated circuits and epitaxially grown materials can be applied to deposit highly uniform layers of the various components on selected regions on the substrate. Such thin-film deposition techniques are generally used in combination with masking techniques to ensure that the components are being delivered only to the predefined regions of interest on the substrate. These techniques can be used to apply thin-films of materials onto a substrate in a combinatorial fashion, thus creating arrays of resulting materials that differ in composition, stoichiometry, and/or thickness.

In addition to being used in combination with traditional binary and quaternary masking techniques, the X/Y shutter system can be advantageously used in combination with other masking techniques. For example, the masking system may include a positioning system with x, y, z, and rotational movement capability, and a translation system comprised of masks contained on a strip of material that can be wound onto a roll such that the masks can be displayed in serial fashion by unwinding and winding said rolls. Alternatively, the X/Y shutter system can be used with the previously described method for generating masking strategies for experiments involving the use of distinct groups of reaction components, wherein the members of each group are related in such a way that it would not be desirable for them to interact with one another. The following sets forth an example of how this can be carried out.

It will be readily apparent to those of skill in the art that the foregoing deposition techniques are intended to illustrate, and not restrict, the ways in which the components can be deposited on the substrate. Other deposition techniques known to and used by those of skill in the art can also be used. In addition, it should be noted that, while the instant disclosure would appear to imply that two-dimensional arrays of resulting materials are formed on a substrate, the invention is not limited to this configuration. For example, the novel deposition and masking techniques described herein may be used to form three-dimensional arrays of resulting materials onto a substrate. In one embodiment, these three dimensional arrays will comprise layers of arrays, with each layer comprising different resulting materials than the adjacent layers. Each layer may have arrays of resulting materials with different patterns. For example, an XYZ three-dimensional array may include three different components that vary in one aspect, such as stoichiometry, with the concentration of each component changing along one direction. In another embodiment, the substrate may comprise, for example, a honeycomb structure that includes predefined regions in three dimensions, i.e., length, width and depth. Components may be deposited in layers into the honeycomb structure, or alternatively, into predefined regions at different depths along the honeycomb structure.

While the foregoing invention has been shown and described with reference to a preferred embodiment, it will be understood by those of skill in the art that various changes in form and detail may be made therein without departing from the spirit and scope of the present invention.

The invention claimed is:

1. A shutter mask system for use in a substrate processing chamber, the shutter mask system comprising:
(A) a flange adapted for coupling said mask system to said processing chamber, wherein mounted to said flange are:
    (1) a pedestal for mounting said substrate relative to said processing chamber;
    (2) at least two physical masks, said masks being movably mounted to the flange and positioned to form at least one opening to allow delivery of components through such opening(s) onto said substrate on said pedestal; and
    (3) a substrate heater system mounted on said flange adjacent to said pedestal; and
(B) at least one drive for moving the physical masks in one or more directions to vary at least one of a size, shape and position of the opening relative to the substrate and for generating in a combinatorial fashion an array of resulting materials having composition gradients on said substrate; and
(C) a control system coupled to said drives for controlling movement of the physical masks during deposition and forming an array of resulting materials on the substrate that differ in composition.

2. The shutter mask system according to claim 1, wherein said physical masks comprise apertures formed therein to define said opening when said physical masks overlap one another.

3. The shutter mask system according to claim 1, wherein said at least one drive is mounted to said flange.

4. The shutter mask system according to claim 1, wherein said pedestal is rotatably disposed on said flange.

5. The shutter mask system according to claim 1, wherein the physical masks define an automated two-dimensional shutter system which provides variable masking schemes for spatially selective shadow deposition.

6. The shutter mask system according to claim 5, wherein said automated two-dimensional shutter system is comprised of two shutter plates that move in two perpendicular directions so that shutter plates overlap with each other in certain regions.

7. The shutter mask system according to claim 1, wherein said pedestal is disposed on said substrate heater system.

8. The shutter mask system according to claim 1, wherein the heater system comprises a gradient temperature mechanism so that different parts of said substrate can be heated to different temperatures at the same time.

9. The shutter mask system according to claim 1, wherein the heater system allows fabrication of thin film samples at different temperatures in a single experiment on a given chip.

10. The shutter mask system according to claim 1, wherein said physical masks and the pedestal are detachable and exchangeable with respect to said flange from experiment to experiment in order to minimize cross contamination of materials.

11. A shutter mask system for use in a substrate processing chamber, the shutter mask system comprising:
 (A) a flange adapted for coupling said mask system to said processing chamber, wherein mounted to said flange are:
  (1) a pedestal for mounting said substrate relative to said processing chamber; and
  (2) a plurality of shutter plates, said shutter plates being movably mounted with respect to said pedestal and positioned to form at least one opening to allow delivery of components through the opening onto said substrate on said pedestal; and
 (B) at least one drive for moving the shutter plates in at least one direction to vary at least one of a size, shape and position of the opening relative to the substrate and for generating in a combinatorial fashion an array of resulting materials having composition gradients on said substrate; and a rotatable substrate heater system mounted adjacent said pedestal,
wherein said pedestal, said shutter plates, said at least one drive and said heater system and said flange are integrated into a single modular assembly.

12. The shutter mask system according to claim 11, further comprising a control system coupled to the drives for controlling movement of the physical masks during deposition and forming an array of resulting materials on the substrate that differ in composition.

13. The shutter mask system according to claim 11, wherein said shutter plates comprise apertures formed therein to define said opening when said shutter plates overlap one another.

14. The shutter mask system according to claim 11, wherein said shutter plates, said pedestal, said heater system and said at least one drive are adjustably mounted to a vacuum flange.

15. The shutter mask system according to claim 11, wherein the shutter plates define an automated two-dimensional shutter system which provides variable masking schemes for spatially selective shadow deposition.

16. The shutter mask system according to claim 15, wherein said automated two-dimensional shutter system comprises two shutter plates that move in two perpendicular directions so that shutter plates overlap with each other in certain regions.

17. The shutter mask system according to claim 11, wherein said pedestal is rotatably disposed on said substrate heater system.

18. The shutter mask system according to claim 11, wherein the heater system comprises a gradient temperature mechanism so that different parts of said substrate can be heated to different temperatures at the same time.

19. The shutter mask system according to claim 11, wherein the heater system allows fabrication of thin film samples at different temperatures in a single experiment on a given chip.

20. The shutter mask system according to claim 11, wherein physical masks and the pedestal are detachable and exchangeable with respect to said flange from experiment to experiment in order to minimize cross contamination of materials.

21. The shutter mask system according to claim 11, wherein the heater system is linearly adjustable relative to the shutter plates.

22. The shutter mask system according to claim 11, wherein the heater system slides in a linear motion along pillars extending between said at least one drive and said pedestal.

23. The shutter mask system according to claim 11, wherein linear and rotational movement of said pedestal is accomplished through a single shaft extending from said at least one drive.

* * * * *